US008772065B2

(12) United States Patent  (10) Patent No.: US 8,772,065 B2
Bogner et al.  (45) Date of Patent: Jul. 8, 2014

(54) HOUSING BODY AND METHOD FOR PRODUCTION THEREOF

(75) Inventors: Georg Bogner, Lappersdorf (DE); Karlheinz Arndt, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/611,890

(22) Filed: Sep. 12, 2012

(65) Prior Publication Data

US 2013/0005091 A1  Jan. 3, 2013

Related U.S. Application Data

(62) Division of application No. 11/921,368, filed as application No. PCT/DE2006/000778 on May 5, 2006, now Pat. No. 8,288,791.

(30) Foreign Application Priority Data

May 30, 2005  (DE) .......................... 10 2005 024 668

(51) Int. Cl.
 *H01L 21/00*  (2006.01)
(52) U.S. Cl.
 USPC  438/33; 257/99; 257/E23.173; 257/E21.599; 438/28; 438/113; 438/460
(58) Field of Classification Search
 CPC ..... H01L 21/70; H01L 21/304; H01L 21/461; H01L 21/768; H01L 21/76802; H01L 33/62
 USPC ............. 257/99, E23.169, E23.173, E21.599; 438/26, 28, 113, 460
 See application file for complete search history.

(56) References Cited

U.S. PATENT DOCUMENTS

| | | | |
|---|---|---|---|
| 4,288,841 A | | 9/1981 | Gogal |
| 4,328,530 A | * | 5/1982 | Bajorek et al. ................ 361/762 |
| 4,681,656 A | * | 7/1987 | Byrum ............................ 216/65 |
| 4,852,227 A | * | 8/1989 | Burks ......................... 29/25.42 |
| 5,035,483 A | | 7/1991 | Waitl et al. |
| 5,223,746 A | | 6/1993 | Abe |
| 6,330,165 B1 | | 12/2001 | Kohjiro et al. |
| 6,965,507 B2 | | 11/2005 | Togashi et al. |
| 7,078,791 B1 | | 7/2006 | Tindle et al. |
| 7,279,723 B2 | * | 10/2007 | Matsumura et al. .......... 257/100 |
| 7,547,630 B2 | * | 6/2009 | Gerber ......................... 438/667 |
| 7,812,364 B2 | | 10/2010 | Seko et al. |
| 2003/0232462 A1 | * | 12/2003 | Poo et al. ..................... 438/117 |

(Continued)

FOREIGN PATENT DOCUMENTS

| EP | 0 400 175 | 12/1990 |
|---|---|---|
| EP | 0 646 971 | 4/1995 |

(Continued)

*Primary Examiner* — Allan R Wilson
(74) *Attorney, Agent, or Firm* — Cozen O'Connor

(57) ABSTRACT

A package body (1) with an upper side (2), with an underside (22), opposite from the upper side (2), and with a side surface, which connects the upper side (2) and the underside (22) and is provided as a mounting surface (19), the package body (1) having a plurality of layers (8) which contain a ceramic material, and a main direction of extent of the layers (23, 24, 25) running obliquely in relation to the mounting surface (19). Furthermore, a method for producing a package body (1) is provided.

13 Claims, 6 Drawing Sheets

(56) References Cited

U.S. PATENT DOCUMENTS

| | | |
|---|---|---|
| 2004/0184202 A1 | 9/2004 | Togashi et al. |
| 2004/0240203 A1* | 12/2004 | Matsumura et al. ........... 362/227 |
| 2004/0251044 A1 | 12/2004 | Choi et al. |
| 2004/0251520 A1* | 12/2004 | Sasaki et al. ................... 257/620 |
| 2005/0093146 A1 | 5/2005 | Sakano |
| 2005/0156189 A1 | 7/2005 | Deguchi |
| 2005/0213334 A1 | 9/2005 | Lee et al. |
| 2005/0278946 A1 | 12/2005 | Tanielian et al. |
| 2006/0091409 A1 | 5/2006 | Epler et al. |
| 2006/0102917 A1 | 5/2006 | Oyama et al. |
| 2006/0131176 A1* | 6/2006 | Hsu ............................... 205/125 |
| 2007/0278511 A1 | 12/2007 | Ohno et al. |
| 2008/0203420 A1* | 8/2008 | Higaki et al. ................... 257/99 |
| 2011/0309406 A1 | 12/2011 | Inoguchi |

FOREIGN PATENT DOCUMENTS

| | | |
|---|---|---|
| GB | 2 395 605 | 5/2004 |
| JP | 05-275750 | 10/1993 |
| JP | 10-242509 | 9/1998 |
| JP | 2001-077408 | 3/2001 |
| JP | 2002-368279 | 12/2002 |
| JP | 2003-304002 | 10/2003 |
| JP | 2004-266124 | 9/2004 |
| JP | 2004-311467 | 11/2004 |
| JP | 2005-039177 | 2/2005 |

* cited by examiner

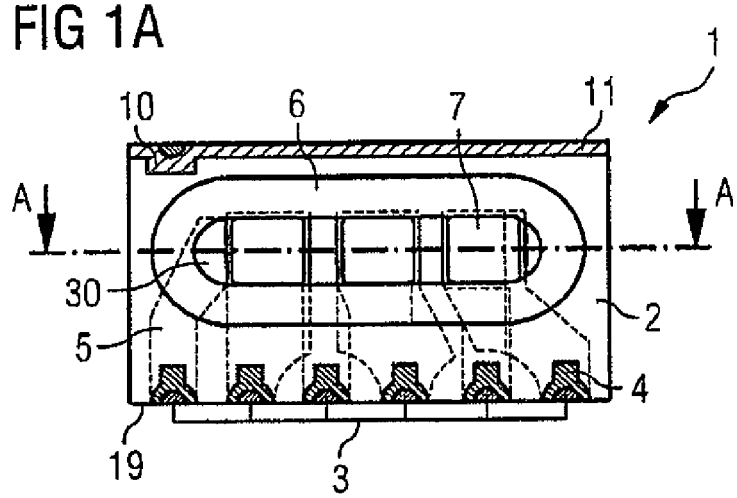
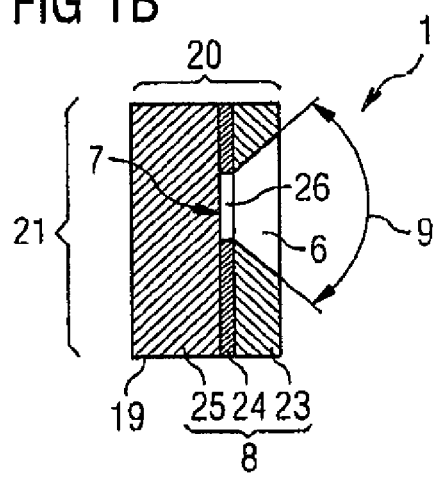
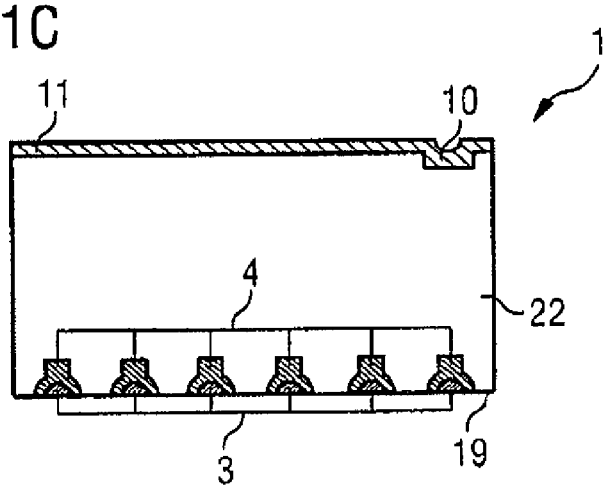

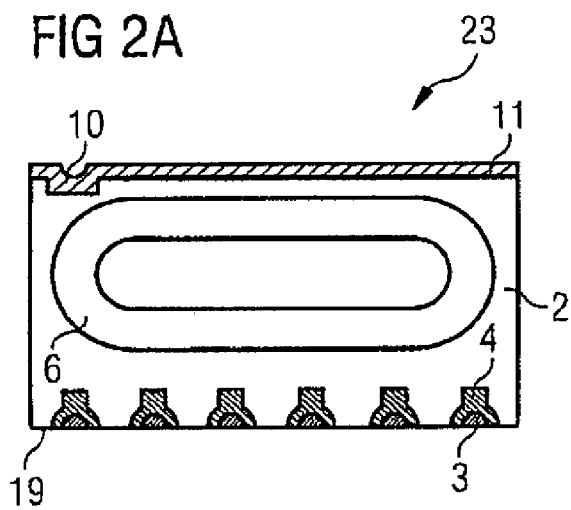
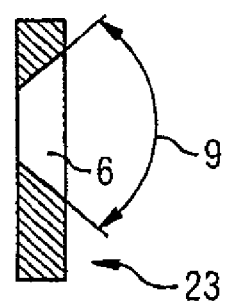
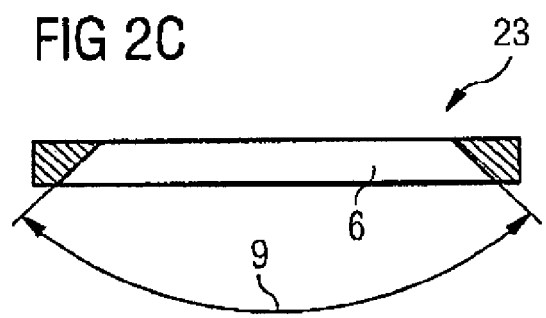
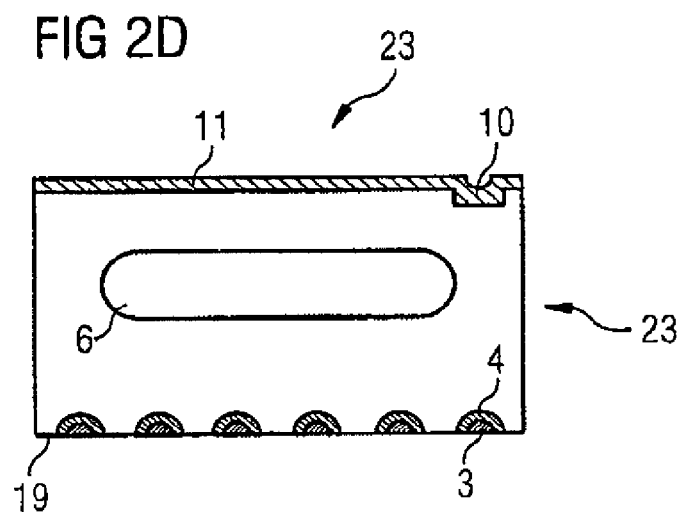

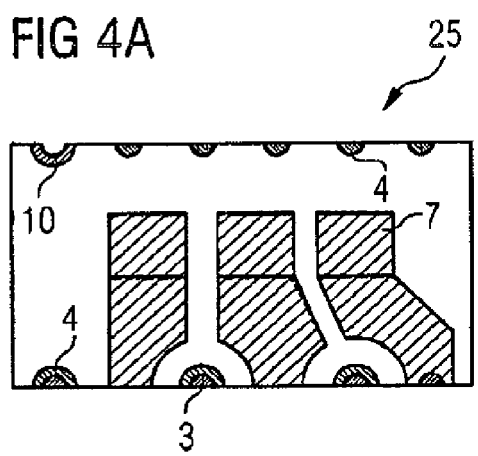
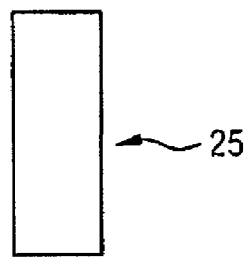
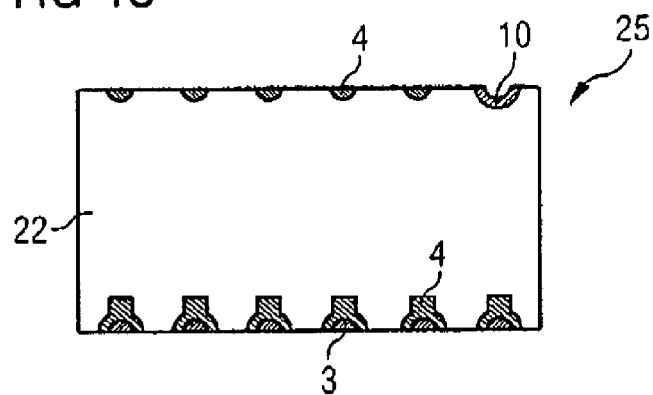

HOUSING BODY AND METHOD FOR PRODUCTION THEREOF

CROSS REFERENCE TO RELATED APPLICATIONS

This application is a divisional of U.S. patent application Ser. No. 11/921,368 which was filed with the U.S. Patent and Trademark Office on Oct. 31, 2008, and which is a U.S. national stage of application No. PCT/EP2006/000778, filed on 5 May 2006. Priority is claimed from German patent application no. 10 2005 024 668.0 filed May 30, 2005.

BACKGROUND OF THE INVENTION

1. Field of the Invention

The invention relates to a package body and to a method for its production.

2. Description of the Related Art

A package body of this type may be used for a component which, because of its lateral radiation, is referred to as a laterally emitting component (a so-called "sidelooker"). The laterally emitting component may be produced in various ways. For example, it may be produced on the basis of a leadframe.

The laid-open application EP 0 400 175 A1 discloses a sidelooker which has a metallic carrier as a leadframe with electrical terminals, a semiconductor chip being applied to one of the terminals. The semiconductor chip and some of the terminals are encapsulated with a polymer, for example with thermosets or thermoplastics, after the application of the semiconductor chip, the polymer forming the package of the sidelooker. The sidelooker may emit and/or receive infrared or visible light.

In the case of a laterally emitting component comprising a package with a polymer material of this type there is the risk of degradation or material fatigue of the package under radiation at a wavelength below approximately 500 nm. This can reduce the service life of the component considerably.

SUMMARY OF THE INVENTION

An object of the present invention is to provide a package body having an increased service life. In particular, degradation of the package body is intended to be avoided at comparatively short wavelengths below 500 nm.

A further object of the invention is to provide a laterally emitting component having an increased service life which is not susceptible to degradation, in particular even at comparatively short wavelengths below 500 nm.

Another object of the invention is to provide a production method for such a package body. This object is achieved by a method according to Patent Claim 25.

The package body has an upper side, an underside, opposite from the upper side, and a side surface, which connects the upper side and the underside and is provided as a mounting surface, the package body having a plurality of layers which contain a ceramic material, and a main direction of extent of the layers running obliquely in relation to the mounting surface.

The layered construction of the package body from a plurality of layers which contain a ceramic material makes particularly simple production of the same possible. The layers may be stacked one on top of the other as green sheets and subsequently sintered. In this case, a green sheet is to be understood as meaning an unsintered ceramic layer, which in this state can still undergo forming, that is to say it can be further processed, for example by cutting, punching or stamping. By subsequent sintering of the green sheets, good adhesion between the individual layers can be achieved. This allows the risk of delamination to be reduced, which has positive effects on the stability or longevity of the package body.

The layers are preferably arranged obliquely in relation to the mounting surface. Particularly preferably, the layers are arranged orthogonally in relation to the mounting surface. This can be realized for example by the layers being formed in a planar manner and an underside of a first layer being arranged on an upper side of a second layer, arranged after the first layer. This arrangement of layers can be continued as often as desired, it being possible to form a stack of layers of any desired size. A side surface of the stack of layers formed in this way serves as the mounting surface of the package body.

By contrast with conventional package bodies, the package body according to the invention is also intended to be suitable for a laterally emitting component with a radiation emission in the infrared or visible range, in particular also for a laterally emitting component for the emission of radiation in the UV or near-UV range, the wavelength of the radiation preferably being below approximately 500 nm, with particular preference below 475 nm or even 430 nm. The unsusceptibility of the package body to degradation, in particular by UV radiation, is decisively determined in part by the material that is used for the package body. A ceramic material generally proves to be unsusceptible to UV radiation. With preference, the package body according to the invention comprises a UV-stable material, with particular preference $Al_2O_3$ or AlN. These two materials also prove to be extremely advantageous with regard to dissipating the heat produced during operation from the package body, to avoid thermally induced failures, since their thermal conductivity is comparatively great. For example, the thermal conductivity of $Al_2O_3$ at temperatures between 30 and 100° C. is about 18 to 30 W/mK and of AlN is about 30 to 180 W/mK. By contrast, conventional polymers have a thermal conductivity which is often below 1 W/mK.

The points mentioned above, that is to say a reduced risk of delamination along with reduced degradation at UV or near-UV radiation and, finally, improved heat dissipation, contribute crucially to the longevity of the package body and, if the package body is used for a laterally emitting component, to an improved service life of the same.

The package body preferably has electrically conducting chip connection areas. Particularly preferably, a first electrically conducting chip connection area is a wire connection area. Most particularly preferably, a second electrically conducting connection area is a chip area. Consequently, in the case of an arrangement of a radiation-generating semiconductor chip in the package body, the semiconductor body can be connected by means of a conductor, preferably by means of a wire connection, to the wire connection area and also mounted on the chip area. In this case, the wire connection area forms a first electrical contact for the semiconductor body and the chip area forms a second electrical contact for the semiconductor body.

Each chip connection area may be applied directly to one of the layers containing a ceramic material. With particular preference, the wire connection area is arranged on a first layer, while the chip area is arranged on a second layer that is different from the first layer.

In this case, each chip connection area may have a small thickness. The thickness preferably lies in the range between $10^{-6}$ m and $10^{-5}$ m; particularly preferably, the thickness is 8

μm. In the case of the invention, the chip connection area does not have to be formed as a carrier or in a self-supporting manner, so that the chip connection area does not have to meet any special requirements for mechanical stability. It is merely necessary for the electrical conductivity to be ensured, which is expediently achieved by the use of a metal. A low overall height of the component can be advantageously realized by the small thickness of the chip connection areas and of interconnects which are connected to the chip connection areas.

The chip connection area is preferably applied to a ceramic-containing layer in the form of a metal-containing liquid or paste, particularly preferably in the form of a metal ink, and cured. For example, the liquid or paste may contain tungsten. Particularly preferably, the liquid or paste is printed onto the layer and cured.

With respect to the risk of detachment of the chip connection areas, the same as already mentioned above applies: the ceramic-containing layers may be sintered with the chip connection areas, whereby an adhesion preventing detachment is produced.

In the case of a preferred refinement of the invention, the package body has at least one electrically conducting via hole ("via"). The via hole may run from the radiation exit side, along the mounting surface, to the underside. It is preferably thereby arranged in such a way that it is connected in an electrically conducting manner to at least one interconnect, which connects a via hole to a chip connection area. The interconnect may be arranged between two ceramic layers.

The via hole is preferably formed in such a way that it is similar to a half-tube or half-cylinder, that is to say the form of the via hole is similar to a tube or a cylinder that is separated along the central plane. This form can be advantageously realized in a simple manner by a cylindrical depression being introduced into the green sheets obliquely in relation to the upper side of the green sheets prior to sintering. Subsequently, the depression may be lined or filled galvanically with a metal-containing material. The cylindrical depression is separated at the end in such a way that a via hole similar to a half-tube or half-cylinder is produced.

Furthermore, the via hole may be described as similar to a channel, the cross section of which may be formed as round, oval, rectangular or polygonal.

The via hole is advantageously surrounded on the upper side and/or underside by metallization. For example, the metallization may be arcuately formed. It preferably matches the form of the via hole. The metallization facilitates the exact positioning of the package body on a printed circuit board during mounting. This is important for the electrical connection to be ensured. Furthermore, the metallization may contribute to the package body centring itself during the IR or reflow soldering.

For arranging a radiation source, for example a radiation-emitting semiconductor chip, the package body has a recess. The recess is preferably arranged in such a way that the radiation emitted from the component can be coupled into a further element with little loss. For example, the further element is a light guide, which may be connected to a carrier. For this purpose, the recess may extend up to closer to the side surface that is opposite from the mounting surface than to the mounting surface.

The recess is advantageously formed as a reflector. For example, the recess may taper in a funnel-shaped manner from the upper side in the direction of the underside. Furthermore, the surface of the recess may be covered with a reflection-increasing layer. This allows the radiation to be concentrated and so the intensity of the laterally emitted radiation to be increased.

A dimension between an edge of the recess and an edge of the package body is preferably approximately 0.3 mm. With particular preference, the dimension is greater than 0.3 mm. Such a dimension allows the radiation that is transmitted through the package body to be reduced and a disadvantageous radiation distribution of the laterally emitting component to be prevented.

The handling of the package body can be made easier by suitable choice of the ratio of the height of the package body to the thickness of the package body. The height of the package body is in this case to be understood as meaning the dimension of the edge running obliquely in relation to the mounting surface. The thickness is to be understood as meaning the dimension of the edge running obliquely in relation to the upper side. The ratio of the height to the thickness is preferably between 1:1 and 2:1.

In this case, tipping of the package body in a packaging tape can be avoided by a ratio greater than 1:1. Furthermore, adequate stability of the package body can be ensured by observance of the upper limit, so that the risk of the package body tipping over during mounting is advantageously low. The specified ratio relates to a package body in which all side surfaces are arranged approximately at right angles to one another.

In a preferred refinement, the package body may be used for a laterally emitting component. For the purpose of generating radiation, the laterally emitting component has at least one radiation source, preferably a radiation-emitting semiconductor chip, which is arranged in the recess. By suitable choice of the number of semiconductor chips that are used, components of different rated output can be advantageously produced.

In the case of a preferred embodiment, at least two semiconductor chips which emit radiation of different wavelengths are arranged in the recess. With appropriate choice of the wavelengths, not only multicoloured light but also mixed-coloured light, preferably white light, can be generated by mixing the radiation. This extends the range of application possibilities for the laterally emitting component. For example, white light is also desired for backlighting a display.

Furthermore, with semiconductor chips which emit radiation of the same wavelength, multicoloured or mixed-coloured light can likewise be generated by use of a conversion element. In this case, the conversion element is arranged downstream of a semiconductor chip and can encapsulate it for example with positive engagement.

Furthermore, a combination of a conversion element with semiconductor chips which generate radiation of different wavelengths is conceivable.

The semiconductor chip may be surrounded by an encapsulating material, preferably by a silicone resin or suitable UV-stable epoxy resin. Furthermore, mixtures of a silicone resin and a UV-stable epoxy resin or of other UV-stable materials or resins are conceivable.

The encapsulating material may serve both as protection against negative mechanical effects and for reducing reflection losses at the interface between the semiconductor chip and the surroundings. The service life of the radiation emitting component and at the same time the coupling-out efficiency can therefore be advantageously increased by the use of a suitable encapsulating material.

In the case of an advantageous embodiment, an optical element, preferably a lens, may be arranged downstream of the semiconductor chip for further beam shaping or concentration. The optical element may be arranged in the recess and/or protrude from the recess.

The package body or the laterally emitting component is preferably mounted on a printed circuit board. Both the electrical supply to the package body or the laterally emitting component and the heat dissipation from the laterally emitting component may advantageously take place via the printed circuit board.

For the electrical supply, the printed circuit board is provided with interconnects, which are arranged in such a way that they permit simplest possible electrical connection of the interconnects to the via holes. For example, the interconnects of the printed circuit board may run in straight lines.

Furthermore, for cooling the package body, the printed circuit board may contain a material with good heat conduction. For example, the printed circuit board is a metal-core circuit board. For optimum transfer of the heat generated in the package body or laterally emitting component to the printed circuit board, adequately large heat-conducting surfaces, for example solderable surfaces, are provided on the underside of the package body. The size of the surface area may be obtained from the size of a single contiguous area or from the sum of the sizes of a plurality of areas that are not contiguous.

In the case of a method for producing a package body with an upper side, with an underside, opposite from the upper side, and with a side surface, which connects the upper side and the underside and is provided as a mounting surface, which package body has a plurality of layers which contain a ceramic material, a sheet is divided into a plurality of package bodies. In this way, a package body can be produced particularly easily.

This manner of production is favourable for the mass production of package bodies and laterally emitting components, allowing costs to be saved in comparison with individual fabrication.

The sheet is preferably formed by a stack of ceramic layers. In this case, it advantageously has recesses on an upper side. After the sheet has been divided up into a plurality of package bodies, the upper side corresponds to the upper side of a package body. Particularly preferably, the package bodies are of the same form and size, so that a regular arrangement of the recesses on the upper side is of advantage.

The sheet advantageously has a planar upper side. In this case, the recesses can be distributed on the upper side like the grid points of a grid.

The package body is intended to have on the mounting surface via holes that are for example similar to a half-tube or half-cylinder. For their production, the sheet is advantageously provided with tube-like or cylinder-like via holes, preferably by tube-like or cylinder-like depressions first being introduced into the green sheets before sintering. These depressions may be lined with an electrically conducting layer or filled with an electrically conducting material, preferably a metal, by means of electroplating. A sufficiently great distance between the via holes must be ensured in this case, in order for example to avoid a short-circuit during subsequent operation if the package body is used for a laterally emitting component.

The via holes formed in this way are uncovered in an efficient way during the dividing-up operation. This is achieved in the case of the invention by the via holes, which are preferably arranged along parallel running straight lines between two adjacent recesses, being separated. The sheet can be separated along the parallel running lines. Particularly preferably, the sheet is divided up in such a way that the via holes are asymmetrically separated.

The asymmetrical separating along a straight line is advantageously carried out in such a way that a first package body has on the mounting surface via holes that are well formed for the electrical conduction, while a second package body, adjacent to the first package body, generally has no via holes, or remains of the separated via holes, on the side surface that is opposite from the mounting surface.

Before the separating, the later mounting surface of the first package body is adjacent to the later side surface of the second package body that is opposite from the mounting surface. This type of separating is extremely efficient, since no scrap is produced when the sheet is divided up. Furthermore, as a result, the production time can be minimized, because the package bodies are of the correct size after separating, dispensing with the need for secondary finishing.

A preferred method for the asymmetrical separating is that of asymmetrically sawing through the sheet, preferably along the parallel lines. In this case, it must be ensured that substantially an upper half of the via holes is preserved on the later mounting surface of the first package body, while substantially a lower half of the via holes is removed by a sawing track, so that a smooth, planar surface is produced on the later side surface of the second package body that is opposite from the mounting surface. It is of advantage if this side surface, which may serve as a surface for attachment by suction during component loading, to be formed in such a way that it is particularly smooth, since it can then be sucked into place more easily.

Before the sheet is divided up, a radiation-emitting semiconductor chip may be preferably mounted in every recess.

After production, the package body may be arranged on a printed circuit board, to be precise in such a way that the via holes are contacted by interconnects of the printed circuit board.

The laterally emitting component may be advantageously used for applications in which a low component height is desired. This is so because the lateral radiation allows the component to be arranged laterally with respect to an element that is to be illuminated in a horizontal plane with the latter. In the case of a vertically radiating component, on the other hand, it is to be arranged downstream of the element to be illuminated in the vertical direction, whereby the overall height of the component may be increased. Furthermore, a laterally emitting component is favourable for light to be coupled into a light guide that is formed for example in a planar manner.

For example, a laterally emitting component may be used for the backlighting of mobile phone displays, mobile phone keypads or LCDs. Furthermore, it may be advantageously used in navigation systems, flashing indicators or high-temperature applications.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

FIGS. 1a, 1b and 1c show a schematic front view, a schematic cross-sectional view and a schematic rear view of a first exemplary embodiment of a package body according to the invention, FIGS. 2a, 2b, 2c and 2d show a schematic front view, a schematic cross-sectional view, a schematic longitudinal sectional view and a schematic rear view of a first layer of the package body according to the invention according to the first exemplary embodiment, FIGS. 4a, 4b and 4c show a schematic front view, a schematic cross-sectional view and a schematic rear view of a third layer of the package body according to the invention according to the first exemplary embodiment.

DETAILED DESCRIPTION OF THE PRESENTLY PREFERRED EMBODIMENTS

Figure 3A:
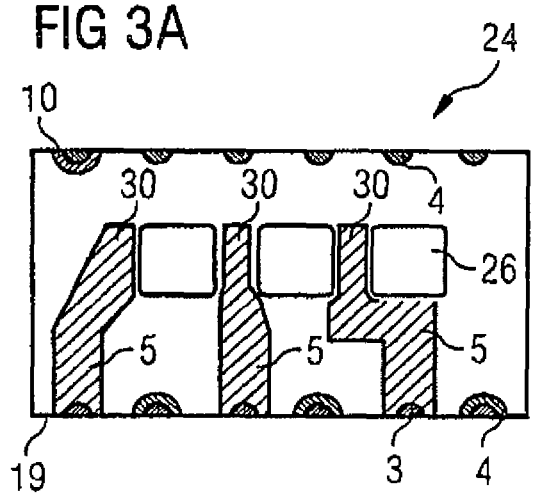
FIGS. 3a, 3b and 3c show a schematic front view, a schematic cross-sectional view and a schematic rear view of a second layer of the package body according to the invention according to the first exemplary embodiment.

The upper side 2, shown in FIG. 1a, of the package body 1 forms a radiation exit side of a radiation emitting component. The upper side 2 is the front side of a first layer, which with a second layer and a third layer arranged downstream of the first layer preferably forms a stack of layers, the package body 1 comprising this stack of layers.

The first layer has a recess 6, which tapers from the upper side 2 in the direction of the second layer.

In the case of the package body 1 represented in FIG. 1a, three chip areas 7 are provided in the recess 6. A radiation source, preferably a radiation-emitting semiconductor chip, may be arranged on each chip area 7. For an electrical connection of each chip, a wire connection area 30 and a chip area 7 are respectively provided. Also provided is a via hole 3, which is connected to a wire connection area 30 or a chip area 7 by means of an interconnect 5.

The via holes 3 preferably contain a metal, particularly preferably tungsten. The via holes 3 are semicircularly formed. They run along the mounting surface 19 from the upper side 2 to the underside opposite from the upper side 2. The via holes 3 may be formed by cutting out depressions in the three different layers and lining or filling them with tungsten, for example by means of electroplating. In this case, the metal layer 11 may serve as an electrode.

In FIG. 1a, six via holes 3 are represented, two adjacent holes of which in each case are respectively connected to a semiconductor chip in an electrically conducting manner. Furthermore, the two adjacent via holes 3 in each case respectively form a first electrical contact and a second electrical contact. Each semiconductor chip is advantageously separately activatable. Alternatively, the semiconductor chips may be connected in series or parallel.

The metallizations 4 surrounding the via holes 3 on the upper side 2 may serve like the metallization 10 for the purposes of marking. With the aid of the position of the via hole 3 that is identified by the metallization 4, an electrical connection of the via holes 3 to interconnects arranged on the printed circuit board can be made easier when the package body 1 is mounted on a printed circuit board. Similarly, the metallization 10 makes it easier for the orientation of the package body 1 to be established.

Furthermore, the metallizations 4 may contribute to the package body 1 centring itself during IR or reflow soldering.

The horizontal line A-A forms the center axis of the recess 6 and runs parallel to the mounting surface 19. It is further away from the mounting surface 19 than from the side surface that is opposite from the mounting surface 19. The off-center arrangement of the recess 6 has the advantage that efficient coupling-in of the emitted radiation, for example into a light guide, is made easier.

The parts of the figure that are represented by dashed lines are elements of the second and third layers and are explained in more detail in conjunction with FIGS. 3 and 4.

In FIG. 1b, the cross-sectional view of the package body 1 is schematically represented. A stack of layers 8, which comprises three layers 23, 24, 25 which contain a ceramic material, can be seen.

The layer 23 has the recess 6, which is advantageously formed as a reflector. The reflector has to meet the requirement that it concentrates the radiation emitted by a semiconductor chip arranged in the recess 6 in such a way that the laterally emitting component has a particularly high radiation yield. This can be achieved for example by an aperture angle 9 of 90°.

The layer 24 has the chip recess 26, which is adapted in its size to the size of a semiconductor chip which is arranged in the recess on the chip area 7.

The layer 25 may contribute for example to the cooling of the component, and consequently to its stability. The thicker this layer is, the more heat can be absorbed.

For separate mounting of the package body 1, for example on a printed circuit board, the ratio of the height 21 to the thickness 20 must be considered. The ratio is preferably 2:1. For example, the height may be 3.2 mm and the thickness 1.65 mm.

In FIG. 1c, the underside 22 that is opposite from the upper side 2 is schematically represented. The underside 22 has the metallizations 4 surrounding the via holes 3 and the metallization 10, which serve as markings for the orientation of the package body 1, and the metal layer 11 serving as an electrode.

In FIGS. 2A-2D the layer 23 of the package body 1 is schematically represented in various views.

The layer 23 serves in particular for beam control. For this purpose, it has the recess 6, through which the radiation generated by the radiation source arranged under the recess 6 or within the recess (compare FIG. 1a) leaves the laterally emitting component. The beam control may be advantageously influenced by the form of the recess 6.

Shown in FIG. 2a is the upper side 2 of the package body 1, which at the same time forms the radiation exit side of the laterally emitting component. The via holes 3, the metallizations 4 and 10, the electrode 11 and the recess 6 are represented. The recess 6 may be ovally formed, as represented. Furthermore, it may taper in a funnel-shaped manner from the front side to the rear side of the layer 23.

In FIG. 2b, the layer 23 is schematically represented in cross section. The layer 23 contains a ceramic material. In production, the layer 23 may be partially hollowed out, so that the recess 6 is created. The recess 6 in this case resembles a truncated cone. It is suitable as a reflector, the aperture angle preferably being 90°. Similarly, the aperture angle 9 of the recess 6 represented in cross section in FIG. 2c is preferably 90°.

In FIG. 2d, the rear side of the layer 23 is represented. While the metallizations 4 and 10 and the metal layer 11 are applied to the front and rear sides of the layer 23, the via holes 3 extend from the front side to the rear side and thereby run along the mounting surface 19.

Figure 3B:
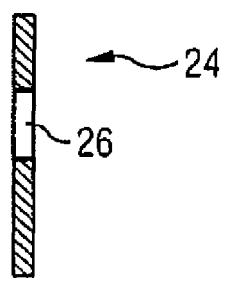
Figure 3C:
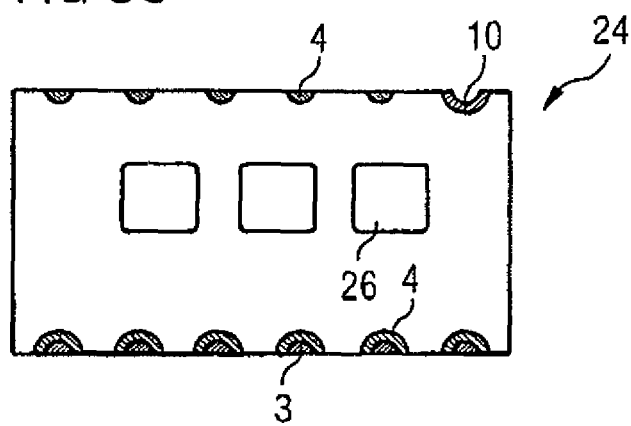

In FIGS. 3A-3C, the layer 24 of the package body 1 is schematically represented in various views.

In FIG. 3A, the front side of the layer 24 is shown. This front side is facing the rear side of the layer 23 in the stack of layers. The layer 24 has electrically conductive wire connection areas 30. Each wire connection area 30 is connected to interconnects 5, the interconnects 5 being adjacent to a via hole 3. At the border with the via hole 3, the interconnect 5 is formed in such a way that the via hole 3 fits exactly into the interconnect 5. The via hole 3 is preferably semicircularly formed at the border with the interconnect 5, while the interconnect 5 has a semicircular indentation.

The interconnects 5 may be used to establish an electrical connection with semiconductor chips for which the chip depressions 26 are provided. Each semiconductor chip is preferably connected by means of a wire to a wire connection area 30 provided for the respective semiconductor chip.

The interconnects 5 are covered by the layer 23, while the wire connection areas 30 lie exposed in the recess 6.

The chip depressions 26 are introduced into the layer 24. Their size preferably corresponds to the size of the chips.

In FIG. 3a, remains of metallizations 4 can be seen on the side of the front side that is facing away from the mounting surface 19. These are the result of the asymmetrical separating of the sheet described above to produce individual components.

In FIG. 3b, a cross section of the layer 24 is schematically represented. The chip depression 26 preferably extends from the front side to the rear side of the layer 24. Particularly preferably, the chip depression 26 approximately forms a cuboidal depression.

In FIG. 3c, the rear side of the layer 24 is schematically represented. This has the metallizations 4 and 10, serving as marking, as well as the chip depressions 26 and the via hole 3.

In FIGS. 4A-4C, the layer 25 is schematically represented in various views.

In FIG. 4a, the front side of the layer 25 is schematically represented. This front side is facing the rear side of the layer 24, the rear side covering the front side virtually completely. Only the chip depressions 26 form windows with respect to the layer 25. Through these windows, the chip areas 7 can be seen. Chips can be arranged on the chip areas 7. The interconnects 5 establish an electrical connection between the chip areas 7 and the via holes 3. The interconnects 5 of the layer 25 are thereby adjacent to different via holes 3 than the interconnects 5 of the layer 24.

In the exemplary embodiment represented in FIG. 4a, three chips can be arranged on three separate chip areas 7, the chips being separately activatable. Alternatively, the chips may be connected in parallel or series and for this arranged on a common chip area.

In FIG. 4b, a cross section of the layer 25 is schematically represented. The layer 25 may form a heat sink. In this case, the ceramic material preferably contained in the layer 25 proves to be advantageous.

In FIG. 4c, the rear side of the layer 25, which at the same time forms the underside 22 of the package body 1, is schematically represented.

Figure 5:
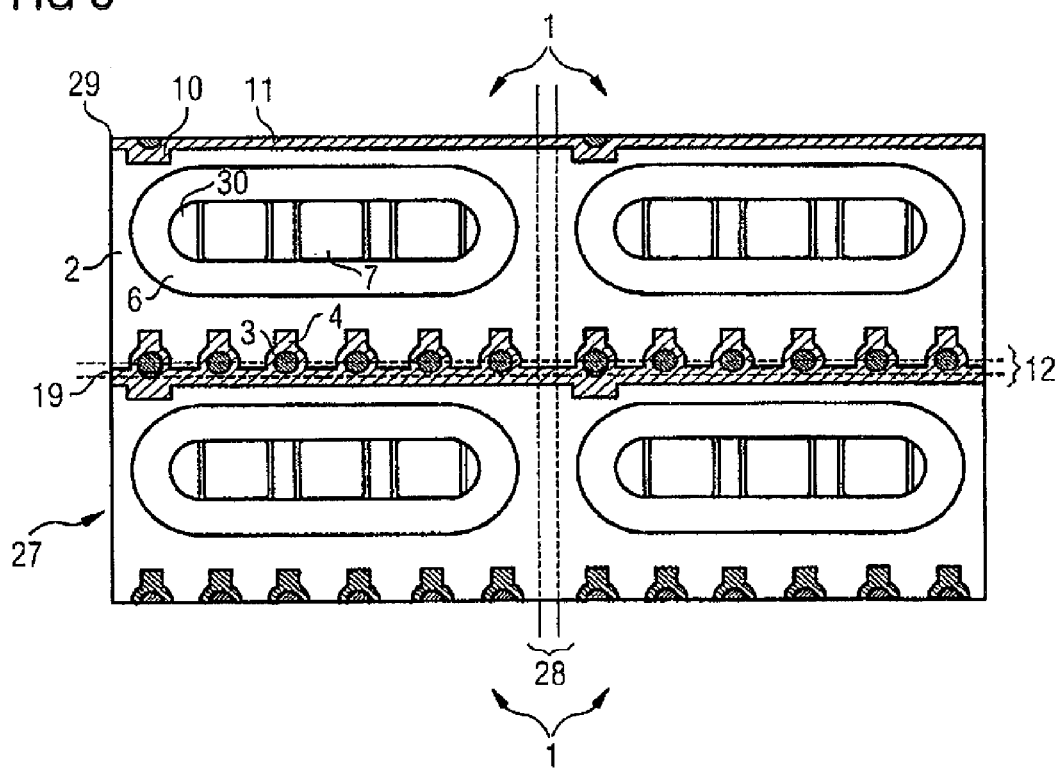
FIG. 5 shows a schematic plan view of a sheet from which the four package bodies are divided up.

In FIG. 5, a sheet 27, which is divided up into four package bodies 1, is represented. The sheet 27 is preferably formed by a stack of ceramic layers. Particularly preferably, the stack of layers comprises three layers. The three layers may be formed in a way corresponding to the layers 23, 24, 25 that are represented in FIGS. 2 to 4.

Consequently, the first layer of the sheet 27 may have the funnel-shaped recess 6, which extends from the upper side, which forms the later upper side 2 of the package body 1, to the rear side of the first layer. Arranged downstream of the first layer are the second and third layers. The wire connection areas 30 of the second layer can be seen and the chip areas 7 of the third layer can be seen.

The metallizations 4 applied to the sheet 27 are preferably arranged along a straight line 12. The sheet 27 can be separated along this line 12. The sheet 27 is advantageously separated in such a way that the via holes 3 are substantially removed on the side surface 29, while they are uncovered on the mounting surface 19. As a result, the package body 1 is provided with electrical connection possibilities only on the mounting surface 19. The side surface 29 is smoothed for the purpose of later mounting of the package body 1, for example on a printed circuit board, in order that it can be loaded with components more easily. For example, the sheet 27 is sawn up along the straight line 12, the sawing track advantageously being chosen to correspond to the width of the straight line 12.

Further separating may be carried out along the line 28, the sheet 27 thereby being separated for example by means of breaking.

Figure 6:
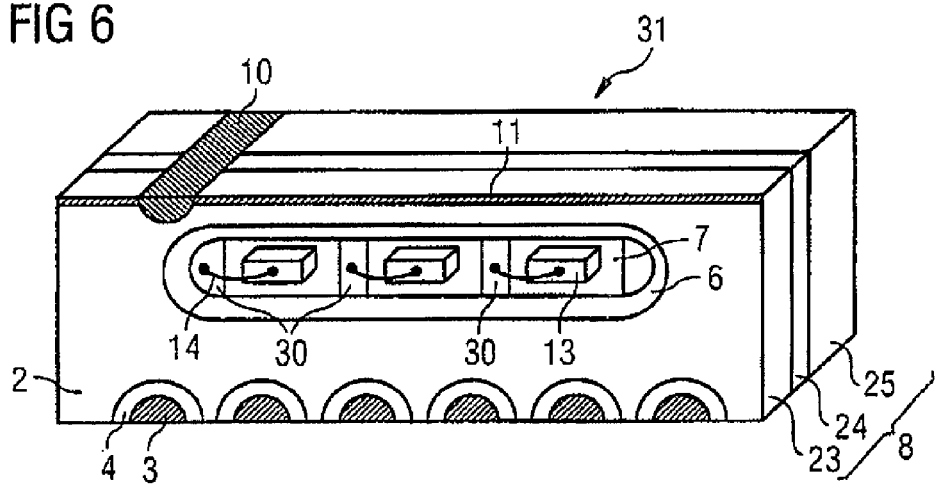
FIG. 6 shows a schematic three-dimensional view of an exemplary embodiment of a laterally emitting component according to the invention.

In FIG. 6, a laterally emitting component 31 that can be divided from the sheet 27 is shown in perspective by way of example. It has a stack of layers which preferably comprises the layer 23, the layer 24 and the layer 25. The layer 23 is provided with the recess 6. Arranged in the recess 6 on each chip area 7 is a chip 13, which is connected to a wire connection area 30 by means of a conductor 14. The chips 13 are preferably applied to the chip areas 7 with an electrically conductive adhesive.

The semiconductor chips 13 may differ for example by the wavelength of the radiation emitted. The wavelength may, for example, lie in the red, green or blue spectral range.

Figure 7:
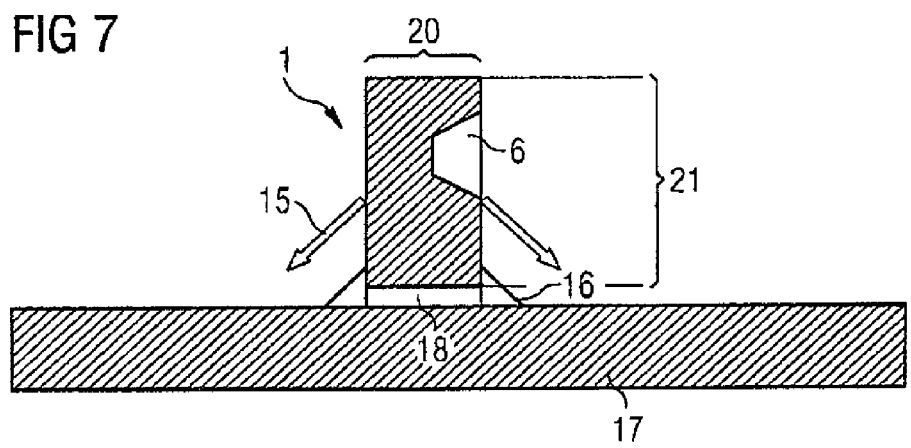
FIG. 7 shows a package body mounted on a printed circuit board.

In FIG. 7, a package body 1 which is mounted on a printed circuit board 17 is represented. The handling of the package body 1 during mounting can be made easier if a ratio of the height 21 to the thickness 20 of 2:1 is chosen. During soldering, tipping forces 15 act on the package body 1. These forces can be counteracted for example by applying symmetrically arranged solder fillets 16. The metal layer 18 may advantageously perform the function of an electrically conducting and/or thermally conducting connection between the package body 1 and the printed circuit board 17.

It should be pointed out that the layers 23, 24 and 25 may be made up of a number of partial layers.

It goes without saying that the explanation of the invention on the basis of the exemplary embodiment described is not to be understood as a restriction of the invention. In particular, individual features of the exemplary embodiments may also be combined in some other way.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for producing a package body with an upper side, with an underside, opposite from the upper side, and with a side surface, which connects the upper side and the underside and is provided as a mounting surface, which package body has a plurality of layers which contain a ceramic material, and a main direction of extent of the layers running at right angles to the mounting surface, the method comprising:

providing a sheet having a stack of ceramic layers and, on an upper side, which corresponds to the upper side of the package body, a plurality of regularly arranged recesses;

arranging via holes, which run from the upper side to the underside, between two adjacent ones of said recesses, and producing the package body by dividing the sheet into a plurality of package bodies, wherein the sheet is divided into the plurality of package bodies such that the via holes are asymmetrically separated in such a way that a first package body has on the mounting surface via holes that are well formed for electrical conduction, and wherein a second package body, adjacent to the first package body, has no via holes or remains of the separated via holes, on a side surface that is opposite from the mounting surface.

2. The method according to claim 1, wherein the via holes are sawn through.

3. The method according to claim 1, wherein at least one radiation-generating semiconductor chip is arranged in the recess before the separating.

4. The method according to claim 1, wherein the package body is arranged on a printed circuit board in such a way that the via holes are contacted by interconnects of the printed circuit board.

5. The method according to claim 1, wherein the sheet is provided with tube-like via holes before the sheet is divided into a plurality of package bodies.

6. The method according to claim 1, wherein producing the via holes comprises introducing tube-like depressions into green sheets before sintering.

7. The method according to claim 1, wherein producing the via holes comprises lining depressions in the sheet with an electrically conducting layer or filled with an electrically conducting material by means of electroplating.

8. The method according to claim 1, wherein the separating of the via holes is carried out in such a way that a first package body has on the mounting surface via holes that are well formed for the electrical conduction, while a second package body, adjacent to the first package body, has no via holes, or remains of the separated via holes, on the side surface that is opposite from the mounting surface.

9. The method according to claim 1, wherein before the separating of the via holes, the later mounting surface of a first package body is adjacent to the later side surface of a second package body that is opposite from the mounting surface.

10. The method according to claim 1, wherein the separating of the via holes is achieved by asymmetrically sawing through the sheet in such a way that an upper half of the via holes is preserved on the later mounting surface of a first package body, while a lower half of the via holes is removed by a sawing track, thereby producing a smooth, planar surface on the later side surface of a second package body that is opposite from the mounting surface.

11. The method according to claim 1, wherein the sheet is divided along a straight line.

12. A method for producing a package body with an upper side, with an underside, opposite from the upper side, and with a side surface, which connects the upper side and the underside and is provided as a mounting surface, which package body has a via hole which extends from the upper side to the underside, and wherein the via hole extends along the mounting surface, the method comprising:

arranging a plurality of regularly arranged recesses on an upper side of a sheet, wherein the upper side of the sheet corresponds to the upper side of the package body, arranging via holes, which run from the upper side to the underside, between two adjacent ones of said recesses; and producing the package body by dividing the sheet into a plurality of package bodies, wherein the sheet is divided into the plurality of package bodies such that the via holes are asymmetrically separated in such a way that a first package body has on the mounting surface via holes that are well formed for electrical conduction, and wherein a second package body, adjacent to the first package body, has no via holes, or remains of the separated via holes on a side surface that is opposite from the mounting surface.

13. A method for producing a package body with an upper side, with an underside, opposite from the upper side, and with a side surface, which connects the upper side and the underside and is provided as a mounting surface, which package body has a plurality of layers that contain a ceramic material, and a main direction of extent of the layers running at right angles to the mounting surface, the method comprising:

providing a sheet having a stack of ceramic layers and, on an upper side, which corresponds to the upper side of the package body, a plurality of preferably regularly arranged recesses;

arranging via holes, which run from the upper side to the underside, between two adjacent ones of said recesses; and producing the package body by dividing the sheet into a plurality of package bodies, wherein the sheet is divided into the plurality of package bodies such that the via holes are asymmetrically separated and wherein the separating of the via holes is achieved by asymmetrically sawing through the sheet such that an upper half of the via holes is preserved on the later mounting surface of a first package body, while a lower half of the via holes is removed by a sawing track thereby producing a smooth, planar surface on the later side surface of a second package body that is opposite from the mounting surface.

* * * * *